United States Patent [19]

Wigby

[11] 4,315,365

[45] Feb. 16, 1982

[54] TERMINAL POST INSERTING COMPONENT

[75] Inventor: Jon Wigby, Pennsylvania Furnace, Pa.

[73] Assignee: Elco Corporation, El Segundo, Calif.

[21] Appl. No.: 140,182

[22] Filed: Apr. 14, 1980

[51] Int. Cl.³ .............................................. H05K 3/30
[52] U.S. Cl. ........................................ 29/739; 29/845; 29/884; 227/136; 227/149
[58] Field of Search ................. 29/739, 741, 845, 842, 29/884; 227/149, 135, 136

[56] References Cited

U.S. PATENT DOCUMENTS

| | | | |
|---|---|---|---|
| 3,250,451 | 5/1966 | Fulop | 227/10 X |
| 3,837,063 | 9/1974 | Wright | 29/739 |
| 3,910,324 | 10/1975 | Nasiatka | 227/136 X |
| 4,018,254 | 4/1977 | De Caro | 227/136 X |
| 4,171,565 | 10/1979 | Boudreau et al. | 29/739 |
| 4,206,543 | 6/1980 | Chisholm | 29/739 |

*Primary Examiner*—Carl E. Hall
*Attorney, Agent, or Firm*—Meyer, Tilberry & Body

[57] ABSTRACT

A ram tip component for inserting terminal posts in a wiring board includes an elongated body having an end face and a terminal post receiving passageway extending into the body through the end face and having outer and inner portions with respect to the end face. A terminal post entry slot extends laterally through the body and the end face and opens into the outer portion of the passageway, and a retaining spring is positioned in the inner portion of the passageway to bias the terminal post in the passageway against a wall thereof. The end of the body opposite the end face is provided with a bore communicating with the inner portion of the passageway, and terminal post stop pins of varying axial length are adapted to be supported in the bore to limit displacement of a terminal post axially inwardly of the passageway. The ram tip is mountable on a reciprocable ram member of a terminal post inserting machine, and a terminal post to be inserted in a wiring board is displaced laterally through the entry slot into the outer portion of the passageway. Thereafter, the ram descends relative to the terminal post for the latter to be displaced inwardly of the passageway whereupon the retention spring engages the terminal post to prevent dropout of the post from the passageway during completion of the inserting operation.

23 Claims, 10 Drawing Figures

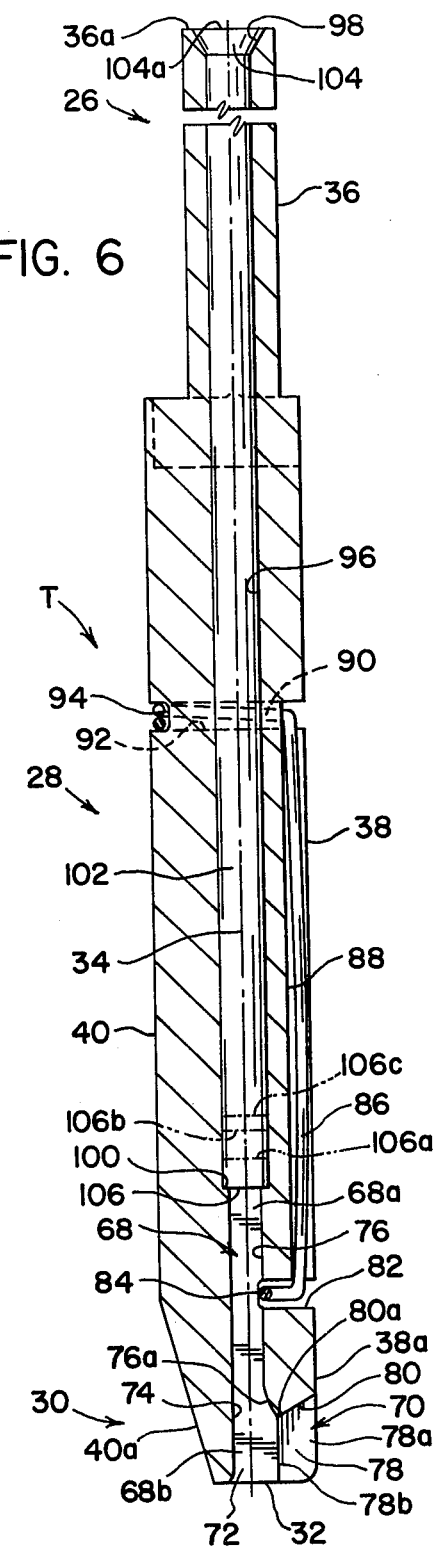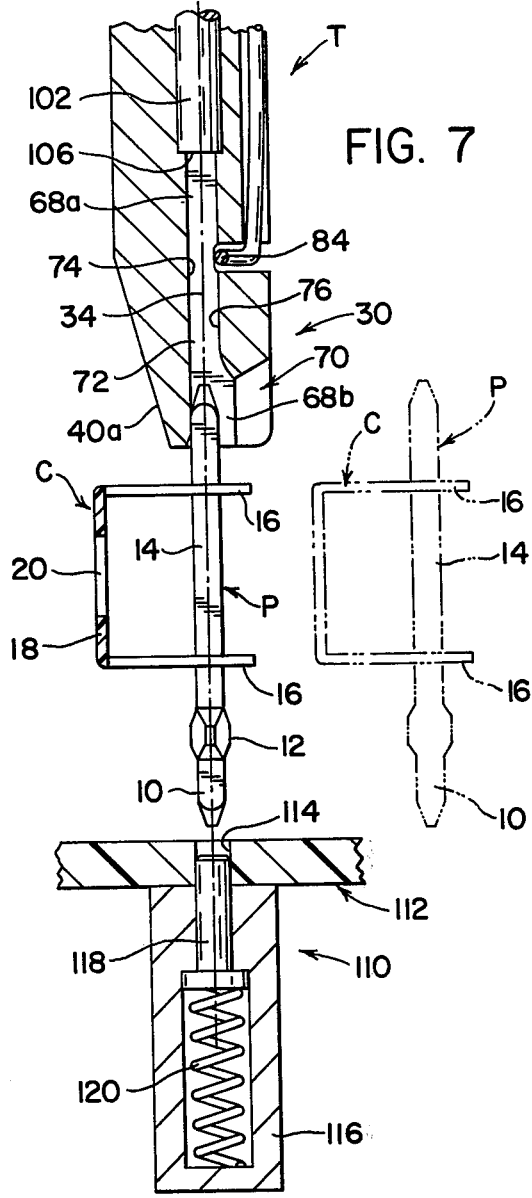

TERMINAL POST INSERTING COMPONENT

BACKGROUND OF THE INVENTION

This invention relates to apparatus for installing elongate articles such as terminal posts in apertures on substrates such as printed circuit boards and, more particularly, to a terminal post inserting component mountable on a reciprocable heat or ram of such apparatus to receive and support a terminal post and insert the post into an aperture in a substrate.

The terminal post inserting component of the present invention, referred to herein as a ram tip component finds particular utility in connection with inserting elongated performed terminal posts of square cross-section in apertures in a wiring board, which terminal posts are individually supported on an elongated carrier strip of flexible material. Accordingly, the invention will be described in detail hereinafter in conjunction with such terminal post structure and carrier strip post support. At the same time, it will be appreciated that the post inserting component can be employed in connection with the inserting of terminal posts having cross-sectional contours other than the square contour disclosed herein, and/or which posts are supported other than through the use of the particular carrier strip disclosed.

Apparatus has been provided heretofore in which terminal posts supported on a polyester carrier strip are transported step-by-step past a work station defined by a vertically reciprocable ram member carrying a post inserting ram tip component, and an anvil therebeneath and over which a circuit board is positioned for an aperture therein to be aligned with the ram tip component. A terminal post on the carrier strip is moved into position between the ram tip and an aperture in the circuit board while the ram is in its uppermost position and, thereafter, the ram descends for an opening in the ram tip to axially receive the upper end of the terminal post. During continued descent of the ram, the terminal post is stripped from the carrier strip by the ram tip component and is inserted into the circuit board aperture as the ram completes its downward stroke. Apparatus of this character and for this purpose is disclosed in U.S. Pat. No. 3,837,063 to Wright, issued Sept. 24, 1974.

The terminal posts to be inserted in a circuit board in the foregoing manner are extremely small in cross-sectional dimension and may have a length from about twenty to forty times the cross-sectional dimension, whereby the posts are readily bendable. Accordingly, extreme accuracy with respect to alignment between the ram tip and terminal post is necessary to assure that the post enters the ram tip. It will be appreciated that the ram tip is rapidly accelerated during initial descent thereof, whereby only a slight misalignment can cause the ram tip to hit the post so that the latter does not properly enter the ram tip if it enters at all. Such impact between the ram tip can result in loss of the post and/or damage to the ram tip. Further, such alignment between the ram tip and terminal post must be maintained following interengagement therebetween to assure alignment between the terminal post and the circuit board aperture for proper insertion of the terminal post therein. Minor misalignment between the post and ram tip either during initial interengagement therebetween or resulting from displacement of the post relative to the ram tip during movement thereof toward the circuit board, can result in loss of the terminal post, damage to the circuit board, and possible damage to the ram tip and ram. It will be appreciated that the ram tip carries the terminal post a considerable distance downwardly to the circuit board after pick-up of the terminal post from the carrier strip and, even if alignment between the terminal post and ram tip component is achieved during initial interengagement therebetween, displacement of the post relative to the ram tip can occur before the post reaches the circuit board aperture as the result, for example, of vibration and/or inadequate support of the post by the ram tip.

Heretofore, ram tip components employed with such terminal post inserting apparatus have included a nose portion defined by normally parallel spaced apart members intended to receive the upper end of a terminal post therebetween during initial downward movement of the ram tip. These nose members are somewhat flexible relative to one another about an imaginary axis spaced axially upwardly from the entrance end therebetween and into which the terminal post initially moves. Further, the nose members are intended to engage diametrically opposite sides of the terminal post upon movement of the post therebetween. It will be appreciated that such a post receiving construction affords no lateral support for the terminal post in the direction parallel to the nose members, whereby misalignment by displacement of the post laterally between the members during or following pick-up of the post is a potential problem. Further, in an effort to frictionally hold the terminal post between the members, the members are spaced apart a distance corresponding to the cross-sectional dimension of the post. Thus, variations in the latter dimension or the spacing of the members can cause problems with regard to retention of the post in the ram tip during movement of the post toward the circuit board, and can increase the likelihood of misalignment by displacement of the post laterally between the nose members. In this respect, for example, if the post is slightly over sized in cross-sectional dimension, the upper end thereof in effect engages and spreads the nose members apart, whereby only the upper end of the post is effectively held between the members. Accordingly, dropout of the post from the ram tip during movement thereof towards the circuit board is likely. If the terminal post is under sized in cross-sectional dimension, it will be appreciated that such dropout will occur as a result of no frictional interengagement between the post and the nose members. While the latter might be avoided to some extent by constricting the entrance end of the opening between the members, it remains that support for the terminal post would only be achieved at the point of constriction, whereby the potential dropout would still be a problem as would be the likelihood of displacement of the post laterally between the nose members as a result of the inadequate support thereof.

The foregoing problems result in loss of terminal posts by dropout and/or bending, circuit board damage from misalignment of posts and apertures in the circuit board, and damage or wear of the ram tip component and ram. These losses in turn result in excessive down time for maintenance, loss in production rate such as by interrupting a sequence of post insertions to clear the work area of loose parts or to insert a post in a location on the circuit board left empty by malfunction, and increased production costs as the result of post losses, maintenance costs, circuit board damage, and/or unacceptable end products.

Additionally, in connection with ram tip components heretofore provided, a different ram tip had to be attached to the ram, and/or the ram tip had to be accurately adjusted axially of the ram in order to provide for the apparatus to achieve proper depth of insertion of terminal posts of different length. Accordingly, production costs are increased by having to maintain a number of different inserting components, and by the down time required to achieve change-over for the apparatus to accommodate a new post length.

SUMMARY OF THE INVENTION

In accordance with the present invention, a ram tip component is provided which advantageously avoids or minimizes the problems heretofore encountered in connection with terminal post insertion, including those enumerated hereinabove. In this respect, a ram tip component in accordance with the present invention accommodates lateral feed of an end portion of a terminal post thereinto prior to ram displacement, thus to initially achieve the desired post and ram tip alignment in the direction of insertion while avoiding pin loss, misalignment and/or ram tip damage which can result from initial physical interengagement therebetween. Further, upon such initial displacement of the terminal post laterally into the ram tip, the post is confined and stabilized against displacement relative to the ram tip during subsequent movement of the ram tip relative to the post, and which displacement would cause misalignment of the post relative to the direction of insertion. Upon displacement of the ram tip relative to the post in the direction of post insertion in the substrate, the post moves into the ram tip and, in accordance with another aspect of the invention, is then positively retained against fallout from the ram tip during movement of the post toward the underlying substrate. Additionally, upon movement of the post into the ram tip, the post is peripherally confined to assure maintenance of alignment of the terminal post with the aperture in the substrate during the remainder of the inserting operation.

In accordance with still another aspect of the invention, the ram tip is adapted to be mounted on a reciprocable ram member and, in connection therewith, is adapted to achieve insertion of terminal posts of different lengths without replacing the ram tip, or adjusting the position thereof relative to the ram. In this respect, the inserting component is adapted to removably support terminal post stop members having different lengths and which, when associated with the ram tip, determine the extent of axial displacement of the terminal post into the ram tip, thus for a terminal post of given length to be axially positioned relative to the inserting component for the desired penetration of the post into the aperture of a substrate during movement of the ram to the end of its stroke in the direction of insertion.

It is accordingly an outstanding object of the present invention to provide an improved ram tip component for receiving, transporting and inserting terminal posts in an apertured substrate.

Another object is the provision of a ram tip component having improved capabilities with regard to initially receiving, supporting and aligning a terminal pin with respect to the direction of insertion thereof and with respect to the ram tip component.

Yet another object is the provision of a ram tip component providing positive alignment of a terminal post relative to the ram tip component following initial insertion of the terminal post thereinto, and throughout the post inserting operation.

A further object is the provision of a ram tip component providing positive post retention against dropout from the ram tip component throughout a post inserting operation.

Yet a further object is the provision of a ram tip component having a post biasing arrangement to positively retain the post therein against dropout.

Still another object is the provision of a ram tip component adapted to accommodate terminal posts of different length for insertion in a substrate in response to reciprocation of the ram tip component through a given stroke.

A further object is the provision of a ram tip component which minimizes down time of post inserting apparatus for maintenance and/or replacement purposes, which minimizes pin loss through dropout and misalignment, which minimizes damage to a substrate and/or the ram tip component resulting from such misalignment or dropout and which, accordingly, reduces production costs and increases production rate and product quality.

BRIEF DESCRIPTION OF THE DRAWINGS

The foregoing objects, and others, will in part be obvious and in part pointed out more fully hereinafter in conjunction with the written description of a preferred embodiment of the invention illustrated in the accompanying drawings in which:

FIG. 6 is a sectional elevation view of the ram tip component and ram member taken along line 6—6 in FIG. 2; and, FIGS. 7, 8 and 9 are sectional elevation views of a portion of the ram tip component and showing relative positions between the ram tip component, a terminal post and substrate during a post inserting operation.

DESCRIPTION OF THE PREFERRED EMBODIMENT

Figure 1:
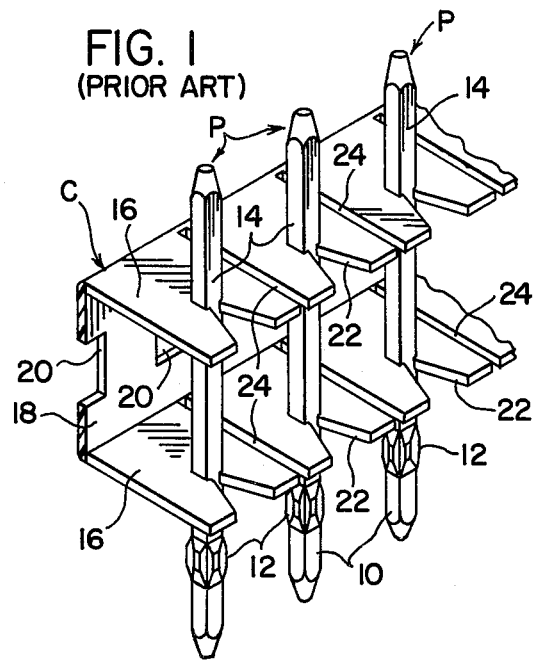
FIG. 1 is a perspective view showing terminal posts mounted on a carrier strip for insertion in a substrate by means of a ram tip component in accordance with the present invention.

Referring now in greater detail to the drawings wherein the showings are for the purpose of illustrating a preferred embodiment of the invention, and not for the purpose of limiting the invention, FIG. 1 illustrates a terminal post carrier strip C supporting a plurality of terminal posts P adapted to be inserted in a substrate by operation of a ram tip component according to the present invention. To facilitate an understanding of the preferred ram tip structure to be described hereinafter, terminal posts P are elongated members of square cross-section having a relatively short tail portion 10, a widened body portion 12 by which the terminal post is press fit into a substrate aperture, and a relatively long contact portion 14. Carrier strip C is an elongate flexible, polyester strip generally C-shaped in cross-section and includes upper and lower legs 16 integral with a web portion 18. Web portion 18 is provided with a plurality of indexing holes 20 which facilitate transporting the carrier strip and posts step-by-step relative to the work station of the post inserting machine for the posts to be individually removed from the carrier strip and inserted in the substrate by the ram tip component. Each of the legs 16 of carrier strip C is provided with a plurality of longitudinally spaced apart necked carrier slots 22 which are disposed in vertically aligned pairs, each pair being adapted to support a terminal post P. Further, adjacent ones of the carrier slots on each of the legs 16 are separated by relief slits 24 extending rearwardly to web 18 of the carrier strip. Accordingly, it will be appreciated that terminal post P are individually supported relative to web 18 of the carrier strip by the corresponding tabs defined between adjacent slits 24.

In accordance with the preferred embodiment of the present invention, a ram tip component T, illustrated in detail in FIGS. 2-6 of the drawing, is adapted to achieve insertion of a terminal post of the structure illustrated in FIG. 1 in an aperture in an underlying substrate in the manner described more fully hereinafter. Referring to FIGS. 2-6, the ram tip component T includes an elongated body of tool steel having a mounting end 26, an intermediate portion 28 and a nose or operating end 30 having an end face 32 transverse to axis 34 of the body. Mounting end 26 of the body is defined by a mounting step 36 which is circular in cross-section, and intermediate portion 28 of the body includes an axially extending planar front face 38 and a circular outer surface 40 extending circumferentially about body axis 34 between the opposite sides of face 38. The ram tip component is adapted to be removably mounted on and supported for reciprocation along axis 34 by a ram member 42 having an upper end suitably attached to a reciprocating drive mechanism of a post inserting machine, not illustrated, and which drive mechanism can for example be defined by a pneumatic or hydraulic piston and cylinder assembly. The lower end of ram member 42 is provided with a bore 44 receiving stem 36 and having a flat end wall 46 at the inner end thereof for the purpose set forth hereinafter. Further, the lower end of ram 42 is provided with a slot extending laterally therethrough and providing opposed spaced apart parallel slot walls 48, and the ram tip component is provided with opposed parallel flats 50 in the area of juncture between mounting stem 36 and intermediate body portion 28 adapted to facially engage the corresponding one of the walls 48 to prevent rotation of the ram tip relative to ram member 42.

Figure 2:
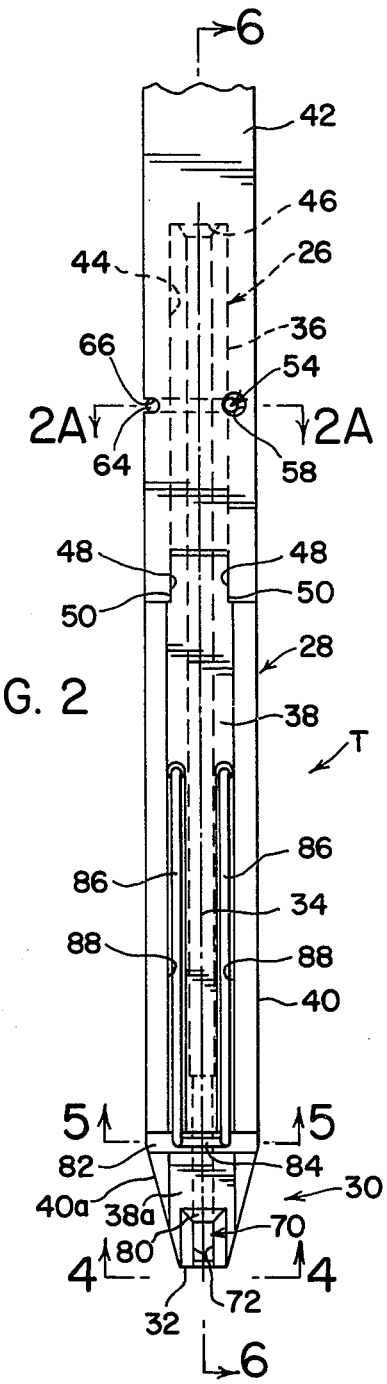
FIG. 2 is a front elevation view of a ram tip component in accordance with the present invention showing the tip mounted on a reciprocable ram member.
Figure 2A:
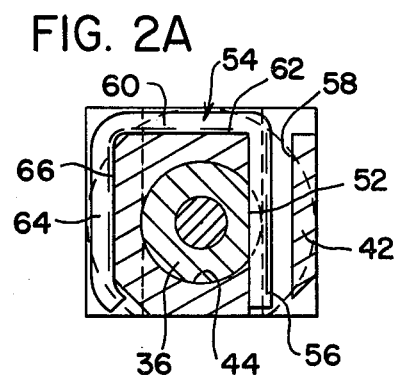
FIG. 2A is a cross-sectional view taken along line 2A—2A in FIG. 2 and showing the ram tip mounting arrangement.
Figure 3:
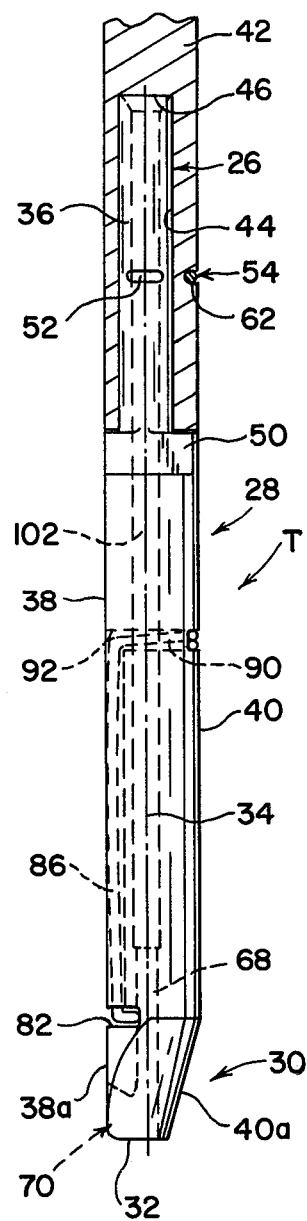
FIG. 3 is a side elevation view of the ram tip component and ram member as seen in the direction from right to left in FIG. 2.
Figure 4:
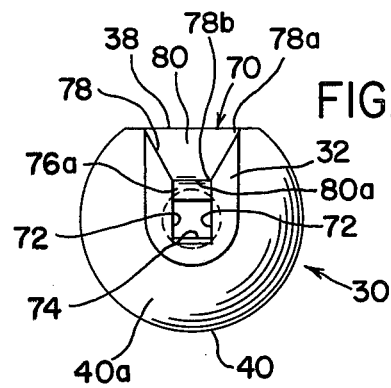
FIG. 4 is a bottom view of the ram tip component as seen along line 4—4 in FIG. 2.

As best seen in FIG. 2, 2A and 3, stem 36 is provided intermediate its opposite ends with a laterally extending recess 52, and ram member 42 carries a generally C-shaped spring component 54 interengaging with recess 52 to releasably mount the ram tip component on the ram member against axial separation therefrom. Spring 54 includes a first leg 56 extending through a bore 58 in ram member 42 aligned with recess 52 in mounting stem 36, a leg 60 connected to leg 56 and extending generally perpendicular thereto through a recess 62 opening laterally outwardly of ram member 42 and a leg 64 connected to leg 60 and extending generally perpendicular thereto and parallel to leg 56 along a recess 66 opening outwardly of ram member 42. Bore 58 is of larger diameter than spring leg 56 and opens laterally inwardly of bore 44 in ram member 42, whereby a portion of spring leg 56 extends laterally into bore 44 to interengage with recess 52 of mounting stem 36. The over sized diameter of bore 58 permits lateral displacement of spring leg 56 outwardly into recess 58 upon the exertion of sufficient axial force on the ram tip component, thus enabling the release and removal of the ram tip component from ram member 42.

As best seen in FIG. 6 of the drawing, operating end 30 of the ram tip component is provided with a terminal post receiving passageway 68 opening axially thereinto through end face 32, coaxial with body axis 34, and having inner and outer portions 68a and 68b, respectively, with respect to end face 32. Operating end 30 further includes a terminal post entry slot 70 opening laterally into outer portion 68b of passageway 68 through end face 32 and through the outer surface of the ram tip body as defined by lower portion 38a of front face 38. Post passageway 68 is defined at outer end 68b thereof by a pair of parallel spaced apart planar side walls 72 and a third wall 74 facing entrance slot 70 and extending between and perpendicular to side walls 72. Inner portion 68a of passageway 68 is defined by coplanar axial extensions of side walls 72 and third wall 74 and, further, by a fourth wall 76 parallel to wall 74 and spaced apart therefrom in the direction toward entry slot 70. In the preferred embodiment, inner passageway portion 68a is square in cross-section.

Post entry slot 70 includes a pair of axially extending entrance walls 78 having outer and inner ends 78a and 78b, respectively. Inner end 78b of each entrance wall 78 intersects the corresponding passageway side wall 72 laterally outwardly of the plane of passageway wall 76, and entrance walls 78 diverge with respect to one another in the direction from inner ends 78b toward outer ends 78a. Entry slot 70 further includes a radially extending end wall 80 between entrance walls 78, which end wall 80 is axially spaced from end face 32 and converges with respect to passageway axis 34 in the direction toward end face 32. End wall 80 has a laterally inner end 80a, and fourth passageway wall 76 has a lower end 76a which curves divergently with respect to passageway axis 34 in the direction toward end face 32 and intersects inner end 80a of end wall 80. Lower end 76a of passageway wall 76 provides for side walls 72 inwardly adjacent entrance slot 70 to extend outwardly relative to passageway wall 76, and these extended portions are coplanar with the innermost portions of side walls 72, whereby inner ends 78b of entrance walls 78 are spaced apart a distance corresponding to the space between passageway side walls 72.

Figure 5:
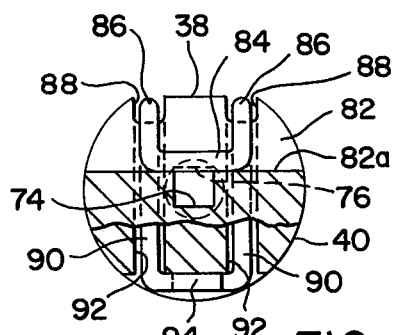
FIG. 5 is a cross-sectional view of the ram tip component taken along line 5—5 in FIG. 2.

A window 82 is provided in operating end 30 of the ram tip component and extends across front face 38 thereof and laterally inwardly of the body and opens into inner portion 68a of post passageway 68. Window 82 receives a post retention spring which serves as set forth more fully hereinafter to positively retain a terminal post in passageway 68 against dropout therefrom. In the embodiment disclosed, the post retention spring is a spring wire element having a U-shaped nose portion received in window 82 and including a leg 84 engaging inner wall 82a of the window, as best seen in FIG. 5. A pair of elongated legs 86 extend longitudinally along front face 38 of the ram tip body from opposite sides of the nose portion, and legs 86 are received in corresponding recesses 88 opening outwardly of front face 38. The spring element further includes a leg 90 at the upper end of each leg 86 and extending transversely thereof through a corresponding bore 92 through the body of the ram tip component. Bores 92 open into a laterally extending notch 94 in the side of the body opposite front face 38, and the terminal ends of legs 90 are bent toward one another in notch 94 to retain the spring element in place on the ram tip component. As shown in FIG. 5, laterally inner wall 82a of window 82 is in a plane spaced slightly inwardly of the plane of fourth wall 76 of post passageway 68, whereby the laterally innermost edge of spring leg 84 projects laterally into inner portion 68a of the post passageway. As set forth more fully hereinafter, this provides for the nose portion of the retention spring to be displaced laterally outwardly upon movement of a terminal post into inner portion 68a of the post passageway for the nose portion to exert a biasing force on the post transverse to the passageway axis toward third wall 74 thereof.

In the preferred embodiment, and for a purpose in connection therewith which will become apparent hereinafter, operating end 30 of the ram tip component is provided with a conically tapered surface 40a behind post entry slot 70. Surface 40a converges with respect to passageway axis 34 in the direction toward end face 32 from an axial location in a plane transverse to the passageway axis and axially bisecting window 82, and has circumferentially opposite lower ends each intersecting lower front face portion 38a adjacent the outer edge 78a of the corresponding entrance wall 78 of slot 70.

As best seen in FIG. 6, ram tip component T is provided with a circular bore 96 extending thereinto through mounting stem 36 coaxial with post passageway 68 and having a conically flared outer end 98 intersecting planar end face 46a of the mounting stem. In the embodiment illustrated, bore 96 has a diameter greater than the cross-sectional dimension of inner portion 68a of post passageway 68, and the axially inner end of bore 96 communicates with inner portion 68a of the post passageway and is defined by a radially extending shoulder 100 which intersects walls 72, 74 and 76 of the post passageway. Bore 96 is adapted to selectively receive one of a number of elongated pin members of different axial length such as pin 102 shown in FIG. 6, and each of which pin members has a head 104 at its outer end adapted to matingly seat in the conically flared outer end 98 of bore 96. Each such pin has an inner end which is axially positioned relative to inner portion 68a of post receiving passageway 68 in accordance with the axial length of the pin. In FIG. 6, numeral 106 represents the inner end of pin 102, and numerals 106a, b and c represent examples of other pin lengths and the positional relationships between the inner ends thereof and inner portion 68a of the post passageway. While ends 106a–c are shown as being axially inwardly of bore 96, the inner end of the pin can be tapered so as to project axially beyond shoulder 100 and into inner portion 68a of the post passageway.

The pin members received in bore 96 are removably captured therein by end wall 46 in bore 44 of ram member 42. In this respect, as will be seen in connection with pin 102, outer end face 104a of pin head 104 is coplanar with end face 36a of mounting stem 36 and, when the ram tip component is interengaged with ram member 42 by inserting mounting stem 36 into bore 44 thereof, end faces 36a and 104a facially engage flat end wall 46 of bore 44. As illustrated and described hereinafter, end 106 of pin 102 provides a stop to limit movement of a terminal post in the direction axially inwardly of inner portion 68a of the post passageway. Accordingly, it will be appreciated that pins having axial lengths as represented by the positions of ends 106 and 106a–c in FIG. 6, enable achieving the insertion of different length posts into a substrate without changing the stroke length of the ram member or axially adjusting the position of the ram tip component relative thereto. It will be further appreciated that removal and replacement of a pin is readily achieved by axially separating the ram tip component from ram member 42, removing the pin from bore 96 either by inverting the ram tip for the pin to drop therefrom or by inserting a suitable pushing tool through post passageway 68, and then dropping a different length pin into bore 96 and remounting the ram tip on ram member 42.

Figure 8:
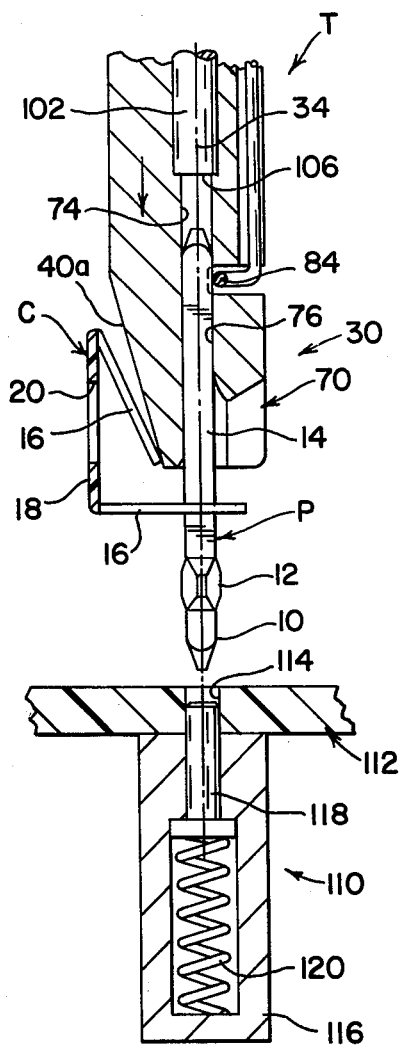
Figure 9:
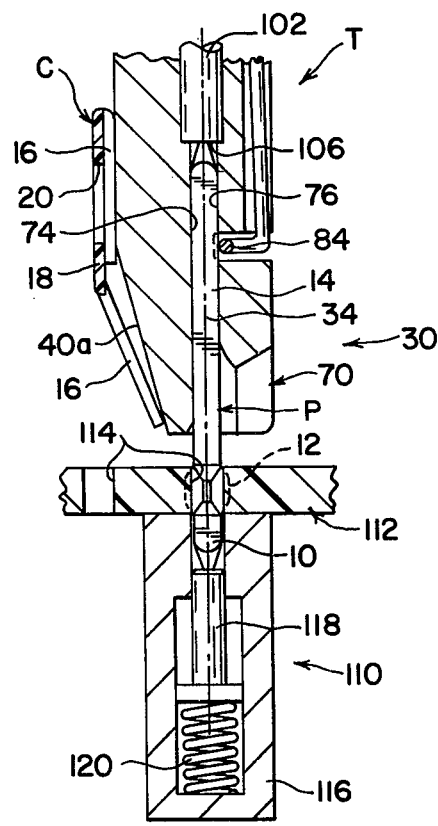

With the foregoing description of the ram tip component in mind, use thereof in connection with inserting terminal posts of the type shown in FIG. 1 into an underlying substrate will be best understood with reference to FIGS. 7–9 of the drawing. While the latter Figures illustrate only the lower portion of ram tip component 28 it will be appreciated from the foregoing description that the ram tip is mounted on the ram member of a terminal post inserting machine and accordingly is reciprocated by the ram member along a linear path having a given stroke length and coaxial with post passageway 68 in the ram tip component. It will be further appreciated that the terminal post inserting machine includes a work station defined by the reciprocable ram tip component and an underlying anvil assembly designated generally by the numeral 110 in FIGS. 7–9, which anvil assembly is axially aligned with the ram tip component and is adapted to support an apertured substrate 112 for an aperture 114 therethrough to be aligned with passageway axis 34. More particularly in this respect, for example, the anvil assembly can include a housing 116 supporting a reciprocable pin 118 having an upper end projecting upwardly from housing 116 so as to enter substrate aperture 114, and which pin 118 is displaceable downwardly into housing 116 against the bias of a spring 120. During insertion of a terminal post, as will be described more fully hereinafter, the lower end of the terminal post engages and depresses pin 118 against the bias of spring 120 and, following post insertion and upward displacement of the ram tip component and substrate, spring 120 displaces the inserted pin upwardly relative to the anvil assembly, thus to facilitate moving the substrate to position another aperture therein in alignment with the ram tip component by means of the projecting end of pin 118.

Referring now in particular to FIG. 7, the terminal post P to be inserted in underlying substrate 112 is initially positioned laterally outwardly of post entry slot 70 as indicated by the broken line position of post P and, at this time, the ram member and thus ram tip component T are stationary and in the upper disposition with respect to the ram stroke. Carrier strip C supports terminal post P in the broken line position thereof for contact portion 14 of the post to be axially and laterally aligned with post entry slot 70. Carrier strip C is then suitably displaced laterally from the broken line to the solid line position thereof, whereby the upper end of contact portion 14 of the terminal post moves through entry slot 70 into outer portion 68b of the post passageway and thus into alignment with inner portion 68a of the passageway. In this position, the upper end of the terminal post is confined in outer passageway portion 68b by side walls 72 and third wall 74 of the passageway against lateral displacement in the directions of these walls, thus to assure the desired alignment between the terminal post and ram tip component. The operator of the post inserting machine then actuates a suitable control to initiate downward movement of the ram member and thus ram tip component T, whereby the latter descends relative to the carrier strip and thus terminal post P from the position shown in FIG. 7 toward the position shown in FIG. 8. During such initial descent of the ram tip component, contact portion 14 of the terminal post moves axially inwardly from outer passageway portion 68b into inner passageway portion 68a, and lower portion 76a of passageway wall 76 assures such entry into inner passageway portion 68a in the event there is any lateral misalignment between the terminal post and the passageway in the direction outwardly toward entry slot 70. Upon movement of contact portion 14 into inner passageway portion 68a, the upper end of the terminal post engages retention spring leg 84 displacing the latter laterally outwardly for the bias thereof to force contact portion 14 of the terminal post against passageway wall 74. Accordingly, the terminal post becomes positively retained against dropout from the passageway during the remainder of the inserting operation. Further in this respect, when terminal post P is removed from carrier strip C as set forth hereinafter, the biasing force of spring leg 84 assures that the entire length of contact portion 14 disposed in the post passageway is biased into facial engagement with the full length of passageway wall 74 to further enhance post retention in the ram tip component.

With further regard to FIG. 8, it will be noted that the conically tapered portion 40a of operating end 30 of the ram tip component engages the upper tab 16 of carrier strip C during the described initial descent of the ram tip component, whereby the tab is deflected downwardly to initiate separation of terminal post P from the carrier strip. It will be appreciated from the description of the carrier strip in connection with FIG. 1 that each terminal post is individually supported by tabs 16 relative to web 18. The carrier strip is suitably supported on longitudinally opposite sides of the work station with respect to the longitudinal dimension of the carrier strip, whereby deflection of tabs 16 corresponding to the post being inserted is readily achieved without interfering with the support of the succeeding terminal post on the carrier strip. Upon further descent of the ram tip component from the position shown in FIG. 8 toward the position shown in FIG. 9, terminal post P is completely separated from carrier strip C by the ram tip component and is displaced therewith toward substrate 112. Contact portion 14 of the terminal post will engage stop pin 102 either during removal of the terminal post from the carrier strip or upon initial movement of tail portion 10 of the terminal post into substrate aperture 114 as the ram member and thus ram tip T approaches the lower end of the stroke thereof. Such engagement axially positions the terminal post relative to the ram tip component for the given stroke of the ram member to achieve insertion of tail portion 10 of the post into the substrate aperture for widened body portion 12 of the terminal post to engage the aperture in a press fit therewith.

Following completion of the inserting operation, the ram member and thus ram tip T are displaced axially upward to the initial position shown in FIG. 7. Either during such ram movement, or thereafter, substrate 112 is suitably repositioned for another aperture 114 therethrough to receive anvil pin 118, thus to align the aperture with the ram tip component. When ram tip T reaches the position shown in FIG. 7, carrier strip C is moved from the solid line to the broken line position shown in the latter Figure and is indexed in the direction perpendicular to the plane of FIG. 7 to position the succeeding terminal post P thereon in alignment with post entry slot 70, after which the inserting operation described above is repeated. In the initial positions of the component parts illustrated in FIG. 7, the lowermost end of terminal post P is shown close to substrate 112 for the purpose of conserving space in the drawing. In actual practice, the substrate generally is spaced several inches below the location depicted in FIG. 7.

In the preferred embodiment herein illustrated, terminal posts P are 0.025 inch square in cross-section, and inner portion 68a of the terminal post passageway is from 0.027 to 0.028 inch square in cross-section. Since inner passageway portion 68a is defined in part by coplanar extensions of side walls 72 and third wall 74 of outer passageway portion 68b, it will be appreciated that walls 72 and 74 at outer portion 68b have dimensions relative to axis 34 corresponding to inner portion 68a. The width of post entry slot 70 between inner edges 78b thereof correspond to the distance between side walls 72 of the post passageway and accordingly is from 0.027 to 0.028 inch.

While considerable emphasis has been placed herein on the preferred structure of the ram tip component for use in inserting square terminal posts in a substrate, it will be appreciated that many embodiments of the ram tip component as well as many modifications of the preferred structure thereof can be made without departing from the principals of the present invention. In this respect, for example, the ram tip component as structurally described herein can be employed for inserting terminal posts which are round in cross-section as well as other terminal posts having a cross-sectional configuration which would provide an equilateral polygon other than a square. It will be further appreciated that the terminal post passageway in the ram tip component can be configured and dimensioned in cross-section to laterally receive and achieve insertion of terminal posts which, for example, would be rectangular as opposed to square in cross-section. Further, arrangements other than the retaining spring arrangement disclosed herein can be provided for positively retaining a terminal post in the post passageway in the ram tip member and, for example, such retention as well as the desired alignment could be achieved by means of a garter-type spring seated in the inner portion of the passageway so as to surround and circumferentially engage the upper end of a terminal post upon movement of the latter inwardly of the passageway. Still further, the bore in the ram tip component receiving the stop pins for positioning the terminal post axially of the post passageway could be of the same cross-sectional contour and dimensions as the post receiving passageway, and the removable and replaceable stop pins can be removably retained in the ram tip component other than by cooperative interengagement between the mounting stem and ram member as illustrated herein. It will be further appreciated that the ram tip component can be releaseably interengaged with the ram member by arrangements other than the spring release arrangement described herein. Such embodiments and modifications of the preferred embodiment will be obvious and suggested to those skilled in the art upon reading the foregoing description of the preferred embodiment and, accordingly, it is to be distinctly understood that the foregoing descriptive matter is to be interpreted merely as illustrative of the present invention and not as a limitation.

Having thus described the invention, the following is claimed:

1. A component for inserting a terminal post into an opening therefor in a substrate, comprising an elongate body having opposite ends, one of said ends including an end face and a post receiving passageway extending into said body from said end face toward the other of said opposite ends, said passageway having an axis and outer and inner portions with respect to said end face, said outer portion extending into said body from said end face, said one end further including a post entry slot extending radially into said body and said end face and opening into said outer portion of said passageway, said outer portion of said passageway including wall means having a cross-sectional contour for a terminal post received through said slot to be confined in the direction of entry through said slot and laterally of said direction and positioned for axial movement from said outer into said inner portion of said passageway, and post retention means in said inner portion of said passageway for retaining a terminal post in said inner portion upon axial movement of said post thereinto.

2. The component according to claim 1, wherein said retention means includes spring means for exerting a biasing force radially inwardly transverse to said passageway axis.

3. The component according to claim 1, and means in said body to limit axial movement of a terminal post in the direction inwardly of said passageway.

4. The component according to claim 3, wherein said means to limit terminal post movement includes means providing an opening in said other end of said body communicating with said inner portion of said passageway, and removable stop member means in said opening having an inner end facing said inner portion of said passageway.

5. The component according to claim 1, wherein said post entry slot has axially extending entrance walls providing said slot with laterally outer and inner ends with respect to said outer portion of said passageway, said entrance walls diverging with respect to one another in the direction from said laterally inner toward said laterally outer end of said slot.

6. The component according to claim 5, wherein said entry slot has a radially extending wall axially spaced from said end face of said body and between said entrance walls, said radially extending wall being convergent with respect to said passageway axis in the direction toward said end face.

7. The component according to claim 6, wherein said radially extending wall has an inner end and said inner portion of said passageway has a wall portion diverging with respect to said passageway axis in the direction toward said end face and intersecting said inner end of said radially extending wall.

8. The component according to claim 1, wherein said wall means of said outer portion of said passageway includes a pair of parallel axially extending side walls and a third axially extending wall transverse to said side walls, said third wall facing said entry slot, each said side wall and said third wall being parallel to and radially spaced from said passageway axis for corresponding outer surface portions of a terminal post received through said entry slot to be closely spaced from said side walls and third wall.

9. The component according to claim 8, wherein said retention means includes spring means for exerting a biasing force radially inwardly transverse to said passageway axis.

10. The component according to claim 8, and means in said body to limit axial displacement of a terminal post in the direction inwardly of said passageway.

11. The component according to claim 8, wherein said entrance slot includes a pair of axially extending entrance walls each intersecting a corresponding one of said side walls of said outer portion of said passageway and diverging relative to one another in the direction radially outwardly of said intersections thereof with said side walls, and a radially extending end wall between said entrance walls and axially spaced from said end face.

12. The component according to claim 8, wherein said inner portion of said passageway is defined by coplanar extensions of said side walls and said third wall and further includes a fourth wall parallel to said third wall and spaced therefrom in the direction toward said entry slot.

13. The component according to claim 12, wherein said retention means includes spring means in said inner portion of said passageway for biasing a terminal post in said passageway into engagement with said third wall.

14. The component according to claim 12, and a bore extending into said body from said other end thereof coaxial with said passageway and communicating with said inner portion of said passageway, and pin means removably supported in said bore and having an inner end facing said inner portion of said passageway to limit axial displacement of a terminal post in the direction inwardly of said passageway.

15. The component according to claim 14, wherein said entrance slot includes a pair of axially extending entrance walls each intersecting a corresponding one of said side walls of said outer portion of said passageway and diverging relative to one another in the direction radially outwardly of said intersections thereof with said side walls, and a radially extending end wall between said entrance walls and axially spaced from said end face.

16. The component according to claim 15, wherein said retention means includes spring means in said inner portion of said passageway for biasing a terminal post in said passageway into engagement with said third wall.

17. The component according to claim 16, wherein said radially extending end wall of said entrance slot has an inner end and said fourth wall of said inner portion of said passageway has an end diverging with respect to said passageway axis in the direction toward said end face of said body and intersecting said inner end of said radially extending wall.

18. The component according to claim 17, wherein said one end of said body has an axially extending flat outer surface portion, said outer ends of said entrance walls of said post entry slot intersecting said flat outer surface portion, and said one end further including a conically tapered surface portion converging with respect to said passageway axis in the direction toward said end face and having circumferentially opposite ends each intersecting said flat surface portion adjacent the outer end of a corresponding one of said entrance walls.

19. The component according to claim 18, wherein said body has a recess extending radially thereinto and opening into said inner portion of said passageway through said fourth wall, said recess having an inner end spaced inwardly of said passageway from said fourth wall, said spring means being mounted on said body and including a nose portion in said recess and biased into engagement with said inner end thereof, said nose portion including a portion projecting radially into said inner portion of said passageway when said nose portion is engaged with said inner end of said recess.

20. A component for inserting a terminal post into an opening therefor in a substrate, comprising an elongate body having opposite ends, one of said ends including an end face and a post receiving passageway extending into said body from said end face toward the other of said opposite ends, said passageway having an axis and outer and inner portions with respect to said end face, said one end further including a post entry slot extending radially into said body and said end face and opening into said outer portion of said passageway, said outer portion of said passageway including wall means having a cross-sectional contour for a terminal post received through said slot to be confined in the direction of entry through said slot and laterally of said direction and positioned for axial movement into said inner portion of said passageway, and post retention means in said inner portion of said passageway, said post entry slot having axially extending entrance walls providing said slot with laterally outer and inner ends with respect to said outer portion of said passageway, said entrance walls diverging with respect to one another in the direction from said laterally inner toward said laterally outer end of said slot, and said retention means including spring means in said inner portion of said passageway displaceable to exert a biasing force transverse to said passageway axis and in a direction corresponding to the direction between said outer and inner ends of said entry slot.

21. The component according to claim 20, and further including means providing an opening into said other end of said body communicating with said inner portion of said passageway, and terminal post stop member means removably supported in said opening and having an inner end facing said inner portion of said passageway.

22. The component according to claim 21, wherein said entry slot has a radially extending wall axially spaced from said end face of said body and between said entrance walls, said radially extending wall being convergent with respect to said passageway axis in the direction toward said end face and having an inner end, and said inner portion of said passageway having a wall portion diverging with respect to said passageway axis in the direction toward said end face and intersecting said inner end of said radially extending wall.

23. The component according to claim 22, wherein said one end of said body has an axially extending flat outer surface portion, said outer ends of said entrance walls of said post entry slot intersecting said flat outer surface portion, and said one end further including a conically tapered surface portion converging with respect to said passageway axis in the direction toward said end face and having circumferentially opposite ends each intersecting said flat surface portion adjacent the outer end of a corresponding one of said entrance walls.

* * * * *